(12) United States Patent
Inami et al.

(10) Patent No.: US 10,515,826 B2
(45) Date of Patent: Dec. 24, 2019

(54) LAMINATED MEMBER

(71) Applicant: Sansha Electric Manufacturing Co., Ltd., Osaka (JP)

(72) Inventors: Kazunori Inami, Tsuyama (JP); Takahiro Maruyama, Tsuyama (JP)

(73) Assignee: Sansha Electric Manufacturing Co., Ltd., Osaka (JP)

( * ) Notice: Subject to any disclaimer, the term of this patent is extended or adjusted under 35 U.S.C. 154(b) by 55 days.

(21) Appl. No.: 15/608,274

(22) Filed: May 30, 2017

(65) Prior Publication Data
US 2018/0286703 A1  Oct. 4, 2018

(30) Foreign Application Priority Data
Mar. 31, 2017  (JP) ................ 2017-072938

(51) Int. Cl.
*H01L 21/48* (2006.01)
*H01L 23/498* (2006.01)
*H01L 23/373* (2006.01)
*H01L 23/13* (2006.01)

(52) U.S. Cl.
CPC ...... *H01L 21/4857* (2013.01); *H01L 23/3735* (2013.01); *H01L 23/49822* (2013.01)

(58) Field of Classification Search
CPC ............. H01L 21/4857; H01L 23/3735; H01L 23/3192; H01L 23/49822; H01L 21/0332; H01L 23/13
See application file for complete search history.

(56) References Cited

U.S. PATENT DOCUMENTS

2003/0102553 A1* 6/2003 Ishikawa ............. H01L 23/3735
257/707
2007/0183127 A1* 8/2007 Ishikawa ............. G01N 27/205
361/709

FOREIGN PATENT DOCUMENTS

| JP | 53-015782 |   | 2/1978 |
|---|---|---|---|
| JP | 53015782 A | * | 2/1978 |
| JP | 06-085109 A |   | 3/1994 |

(Continued)

OTHER PUBLICATIONS

JP Patent Application No. 2017-072938, Office Action dated May 23, 2018.

*Primary Examiner* — Steven H Loke
*Assistant Examiner* — Juanita B Rhodes
(74) *Attorney, Agent, or Firm* — Larry E. Henneman, Jr.; Henneman & Associates, PLC

(57) ABSTRACT

The present invention provides a laminated member that prevents contact of a semiconductor chip and an external leading terminal etc. without increasing the number of components. The laminated member is a laminated member having a three-layer structure, comprising: an upper highly thermally conductive layer; a lower highly thermally conductive layer; and an intermediate layer having a low thermal expansion coefficient, wherein the above-described laminated member is larger than the above-described semiconductor chip in a plan view, and wherein a height position of the above-described first peripheral edge area is located at a certain distance below a height position of the above-described first bonding area, and a height position of the second peripheral edge area of the above-described second bonding area is located at a certain distance above a height position of the above-described second bonding area.

25 Claims, 9 Drawing Sheets

(56) References Cited

FOREIGN PATENT DOCUMENTS

| | | | | |
|---|---|---|---|---|
| JP | 06085109 A | * | 3/1994 | ........... H01L 23/051 |
| JP | 06-334073 A | | 12/1994 | |
| JP | 07-078907 A | | 3/1995 | |
| JP | 0778907 A | * | 3/1995 | |
| JP | 07078907 A | * | 3/1995 | |
| JP | 2008-041708 A | | 2/2008 | |
| JP | 2008041708 A | * | 2/2008 | |
| JP | 2009-065144 A | | 3/2009 | |
| JP | 2009065144 A | * | 3/2009 | |
| JP | 2010-103311 A | | 5/2010 | |
| JP | 2010103311 A | * | 5/2010 | |
| JP | 2015-191958 A | | 11/2015 | |
| JP | 2015191958 A | * | 11/2015 | |

* cited by examiner

LAMINATED MEMBER

CROSS-REFERENCE TO RELATED APPLICATIONS

This application claims foreign priority to Japanese Patent Application No. 2017-072938, filed on Mar. 31, 2017 by the same inventors, which is incorporated by reference herein in its entirety.

BACKGROUND OF THE INVENTION

Field of the Invention

The present invention relates to a laminated member used for a semiconductor device, in particular, to a laminated member to be arranged between a semiconductor chip and a heat sink.

Description of Related Art

There is a recent trend that electronic components etc. are densely arranged in a semiconductor device such as a semiconductor module. Such a semiconductor module has a heat sink through which heat generated by the electronic components is released.

FIG. 6 is a cross sectional view showing a main part of a semiconductor module. The semiconductor module comprises a heat sink (not shown) having an insulated substrate with a conductive pattern bonded on a heat dissipation base made from aluminum or copper, a copper-made external leading terminal 41 bonded on the conductive pattern, a semiconductor chip 20 such as a thyristor and a diode, and a laminated member 102 arranged through solders 31 and 32 between the external leading terminal 41 and the semiconductor chip 20.

FIG. 7A is a top view showing a main part of the semiconductor chip 20 as an example, and FIG. 7B is a cross sectional view taken along line B-B shown in FIG. 7A. The semiconductor chip 20 is a plate-like body and has on its top surface a square electrode 21a in the center, a square mesa groove 21b as a structure for maintaining pressure resistance along the peripheral edge of the electrode 21a, and a square chip outer peripheral part 21c along the peripheral edge of the electrode 21b. The semiconductor chip may be cut in the middle of the mesa groove and the chip outer peripheral part may be omitted. The semiconductor chip 20 also has on its bottom surface a square electrode 22a in the center, a square mesa groove 22b along the peripheral edge of the electrode 22a, and a square chip outer peripheral part 22c along the peripheral edge of the electrode 22b. The mesa grooves 21b and 22b are covered with cover glasses. The semiconductor chip may be not only square but also circular.

Silicon is used as a material of such a semiconductor chip 20. The silicon has a coefficient of linear thermal expansion (hereinafter referred to as "coefficient of thermal expansion") of $2.4 \times 10^{-6}/°$ C., while copper has a coefficient of thermal expansion of $16.7 \times 10^{-6}/°$ C., meaning that the copper has a coefficient of thermal expansion six times as large as the silicon. The difference in the coefficients of thermal expansion could cause any cracks or deformation, when the semiconductor chip 20 is directly soldered to the external leading terminal 41.

Accordingly, a molybdenum disk having a coefficient of thermal expansion of $5.5 \times 10-6/°$ C. may be arranged through the solders 31 and 32 between the external leading terminal 41 and the semiconductor chip 20. However, the molybdenum disk is expensive and thus a laminated member having a three-layer structure for compensating for the deformation caused by the difference in the coefficients of thermal expansion is proposed (for example, see Japanese Unexamined Patent Application No. 6-334073). For example, a newly-developed laminated member having a three-layer structure includes "CIC" consisting of an upper copper layer 111, an intermediate layer 110 having a low thermal expansion coefficient, and a lower copper layer 112, as shown in FIG. 6.

Furthermore, the mesa semiconductor chip 20 is required to have a certain distance between the mesa groove 22b and an electric conductor in order to prevent electrical discharge therebetween to protect the structure for maintaining pressure resistance. Accordingly, a laminated member 102, which has as large a size (area) as the electrode 22a of the semiconductor chip 20 in the plan view, is selected and used to prevent the upper copper layer 111 from being located below the mesa groove 22b.

In the semiconductor chip 20 which is bonded to the external leading terminal 41 through the laminated member 102, its peripheral edge part would be projected horizontally. When the laminated member and semiconductor chip 20 are assembled, the peripheral edge part of the semiconductor chip 20 and the external leading terminal 41 may contact due to misarranged soldering of the laminated member 102 to the external leading terminal 41. If the top surface of the semiconductor chip 20 and the external leading terminal 41 contact, an electric current will flow from the top surface of the semiconductor chip 20 to the external leading terminal 41.

Accordingly, a newly-developed laminated member includes a ring 113 for preventing contact between the external leading terminal 41 and the semiconductor chip 20 having a larger outer circumference than the semiconductor chip 20 in the plan view which is attached to the outer circumference of the laminated member 102. FIG. 8 is a cross sectional view showing a main part of a semiconductor module. This prevents the semiconductor chip 20 from contacting the external leading terminal 41 even if the laminated member 102 is misalignedly soldered to the external leading terminal 41. Even if the external leading terminal 41 and the laminated member 102 contact, no electric current will flow, since the external leading terminal 41 and the bottom surface of semiconductor chip 20 are equipotential.

SUMMARY OF THE INVENTION

However, it would take time to not only manufacture the ring 113 but also attach the ring 113 to the outer circumference of the laminated member 102. That is, such a laminated member 102 would require the increased number of components and manufacturing processes. The present invention is made to solve the above-described problems and aims to provide a laminated member that can prevent a semiconductor chip from contacting an external leading terminal etc., without increasing the number of components.

In order to solve the above-described problems, the laminated member of the present invention is a laminated member having a three-layer structure, comprising: an upper highly thermally conductive layer having on its top surface a first bonding area on which an electrode of a semiconductor chip is bonded and a first peripheral edge area of the first bonding area; a lower highly thermally conductive layer having on its bottom surface a second bonding area on which a heat sink is bonded and a second peripheral edge area of the second bonding area; and an intermediate layer having a low thermal expansion coefficient provided between the above-described upper highly thermally conductive layer and the above-described lower highly thermally conductive layer, wherein the above-described laminated member is larger than the above-described semiconductor chip in a plan view, and wherein a height position of the above-described first peripheral edge area is located at a certain distance below a height position of the above-described first bonding area, and a height position of the second peripheral edge area of the above-described second bonding area is located at a certain distance above a height position of the above-described second bonding area.

"Certain distance" described herein refers to a distance sufficient to prevent electrical discharge between the mesa groove etc. and an upper highly thermally conductive layer, where the laminated member described herein is larger than the semiconductor chip in the plan view and thus the upper highly thermally conductive layer will be located below the mesa groove etc.

According to the laminated member of the present invention, the laminated member is larger than the semiconductor chip in the plan view, and thus it can prevent the semiconductor chip from contacting the external leading terminal etc. Furthermore, this saves the trouble of manufacturing the ring and for attaching the ring to the outer circumference of the laminated member. The laminated member can be manufactured in an upwardly and downwardly compressed manner, as described below. It prevents formation of parts, where the intermediate layer having a low thermal expansion coefficient is extremely thin, and raised parts etc. so that thermal stress could be uniformly distributed to prevent warpage of the laminated member.

In the above-described invention, a shape of the bottom surface and a shape of the top surface may be preferably plane symmetrical about a horizontal plane parallel to the top surface and to the bottom surface.

According to the laminated member of the present invention, upwardly and downwardly compressing both ends of a laminated body in the manufacturing step requires only a half of upward deformation amount and a half of downward deformation amount, preventing formation of parts, where the intermediate layer having a low thermal expansion coefficient is extremely thin, and raised parts etc. This can reduce changes in thermal resistance of a thermal-conductivity-involved part and prevent deformation of the laminated material such as warpage even if a width of the laminated member increases. This can prevent deterioration of cooling performance and electrical characteristics (e.g. current density) of the laminated member, even if the width of the laminated member increases.

In the above-described invention, the above-described first peripheral edge area may be preferably square or circular in the plan view, and the above-described first bonding area may be preferably square or circular, located at the center of the above-described first peripheral edge area in the plan view.

According to the laminated member of the present invention, the laminated member does not contact any terminals arranged in four directions.

In the above-described invention, the above-described semiconductor chip may be configured to have a structure for maintaining pressure resistance that surrounds the above-described electrode. In the above-described invention, the above-described structure for maintaining pressure resistance is preferably a mesa structure. In the above-described invention, the above-described structure for maintaining pressure resistance is preferably a guard ring structure. In the above-described invention, the above-described structure for maintaining pressure resistance is preferably a field plate structure.

Effects of the Invention

According to the laminated member of the present invention, the laminated member is larger than the semiconductor chip in the plan view, preventing the semiconductor chip from contacting the external leading terminal etc. Therefore, manufacturing the ring and attaching the ring to the outer circumference of the laminated member is not required.

DETAILED DESCRIPTION OF THE INVENTION

Described below are embodiments of the present invention based on the figures.

Reference Examples

<Semiconductor Module>

Figure 4:
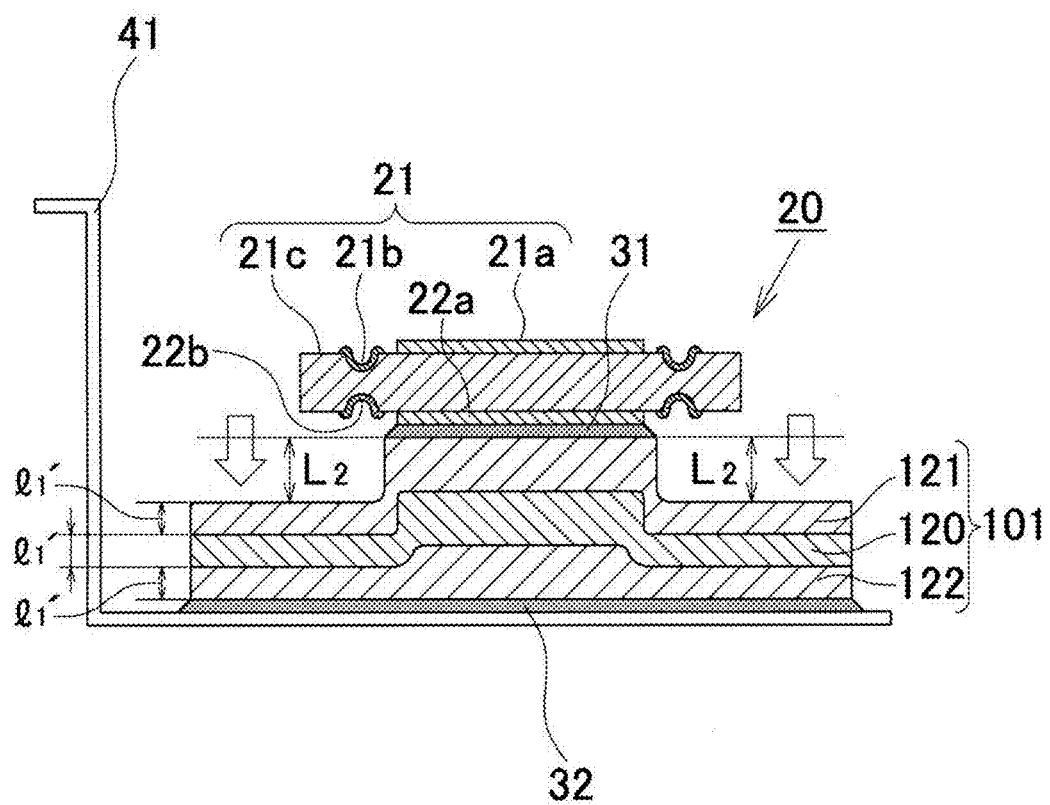
FIG. 4 is a cross sectional view showing a main part of a semiconductor module.

FIG. 4 is a cross sectional view showing a main part of a semiconductor module. In the figure, a vertical direction is defined as a Z direction, a direction vertical to the Z direction is defined as an X direction, and a direction vertical to the Z direction and the X direction is defined as a Y direction. The semiconductor module has a heat sink (not shown), wherein an insulated substrate with a conductive pattern is bonded to a heat dissipation base made of aluminum or copper, an external leading terminal 41 bonded to the conductive pattern, a semiconductor chip 20 such as, for example, a thyristor and a diode, and a laminated member 101 arranged between the external leading terminal 41 and the semiconductor chip 20 through solders 31 and 32.

<Convex-Shaped Laminated Member>

The laminated member 101 is a laminated body with a three-layer structure consisting of an upper highly thermally conductive layer 121, an intermediate layer having a low thermal expansion coefficient 120, and a lower highly thermally conductive layer 122.

The laminated member 101 is in a convex shape having a thicker central part and thinner left and right parts when viewed from the front (X direction). Specifically, the top surface of the left part and the top surface of the right part are located at a certain distance L2 below the height of the top surface of the central part. Further, the laminated member 101 is in a convex shape having a thicker central part and thinner front and rear parts when viewed from the left (Y direction). Specifically, the top surface of the front part and the top surface of the rear part are located at the certain distance L2 below the height of the top surface of the central part.

The laminated member 101 has a first bonding area in a square shape and a first peripheral edge area in a square shape formed in the peripheral edge of the first bonding area when viewed from above (Z direction). The first bonding area is formed so as to be in the same shape as that of the electrode 22a of the semiconductor chip 20 to be attached. The laminated member 101 has a second bonding area in a square shape on its whole surface when viewed from below (−Z direction). Additionally, the outer circumference of the laminated member 101 is larger than the outer circumference of the semiconductor chip 20 to be attached.

Described below is a method for manufacturing a laminated member 101. The peripheral edge area of the laminated body with a three-layer structure is compressed from above to manufacture a laminated member 101.

The peripheral edge area of the laminated body is compressed with a deformation amount L2 from above to manufacture a laminated member 101 shown in FIG. 4. The laminated member 101 has an upper highly thermally conductive layer 121 having a thickness l1, an intermediate layer having a low thermal expansion coefficient 120 having thickness l1, and a lower highly thermally conductive layer 122 having thickness l1 in the central part. It also has an upper highly thermally conductive layer 121 having a thickness l1', an intermediate layer having a low thermal expansion coefficient 120 having thickness l1', and a lower highly thermally conductive layer 122 having thickness l1' in the left, right, front, and rear parts. In this example, the upper highly thermally conductive layer 121, the intermediate layer having a low thermal expansion coefficient 120, and the lower highly thermally conductive layer 122 are represented as having the same thickness, while the intermediate layer having a low thermal expansion coefficient 120 may have a different thickness.

Figure 5:
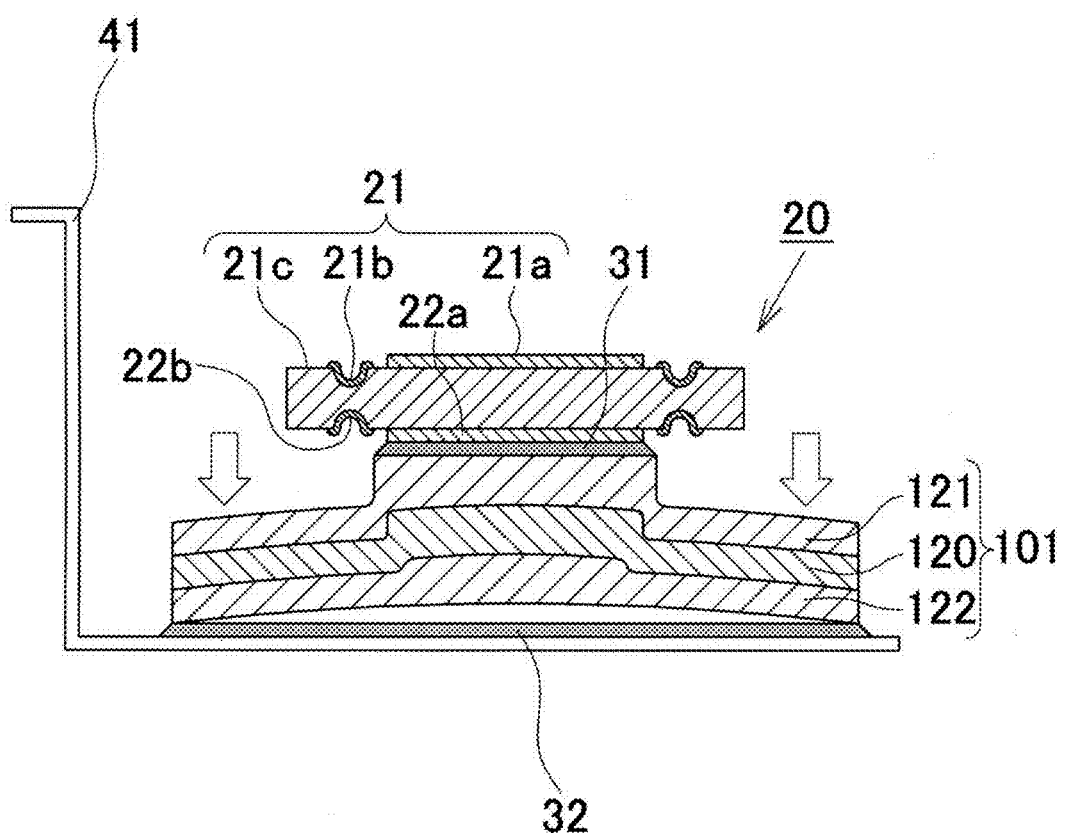
FIG. 5 is a cross sectional view showing a main part of a semiconductor module.
Figure 6:
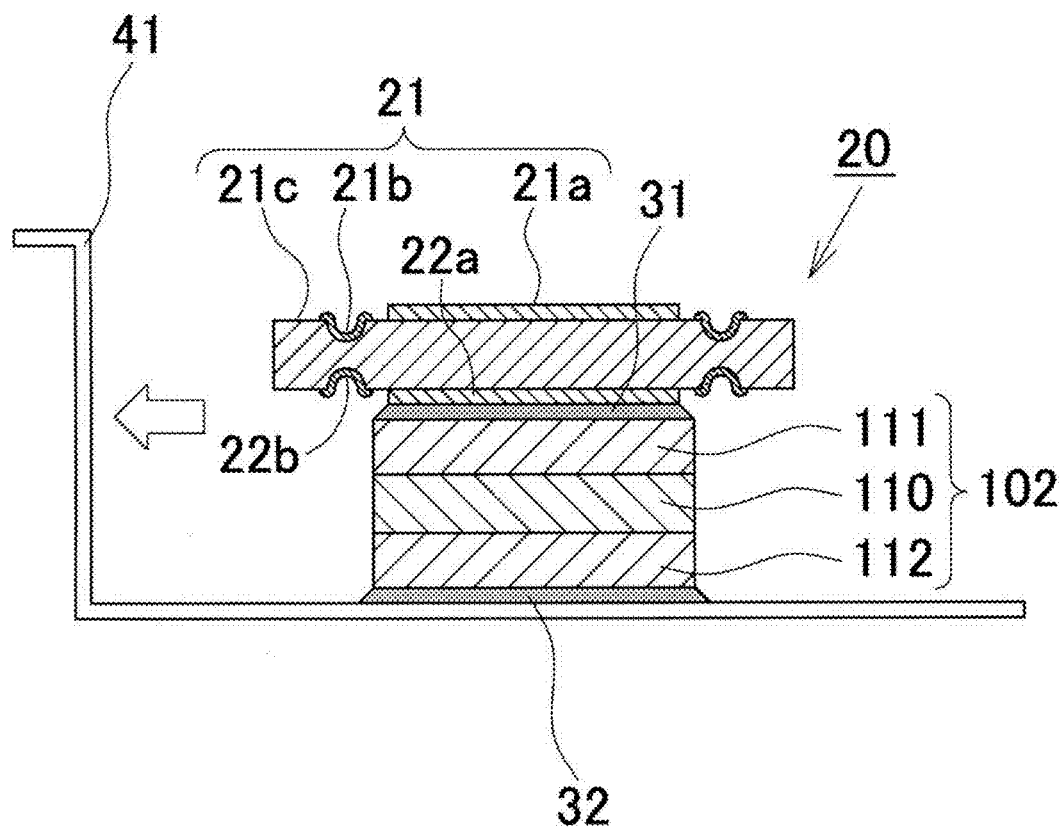
FIG. 6 is a cross sectional view showing a main part of a semiconductor module.
Figure 7A:
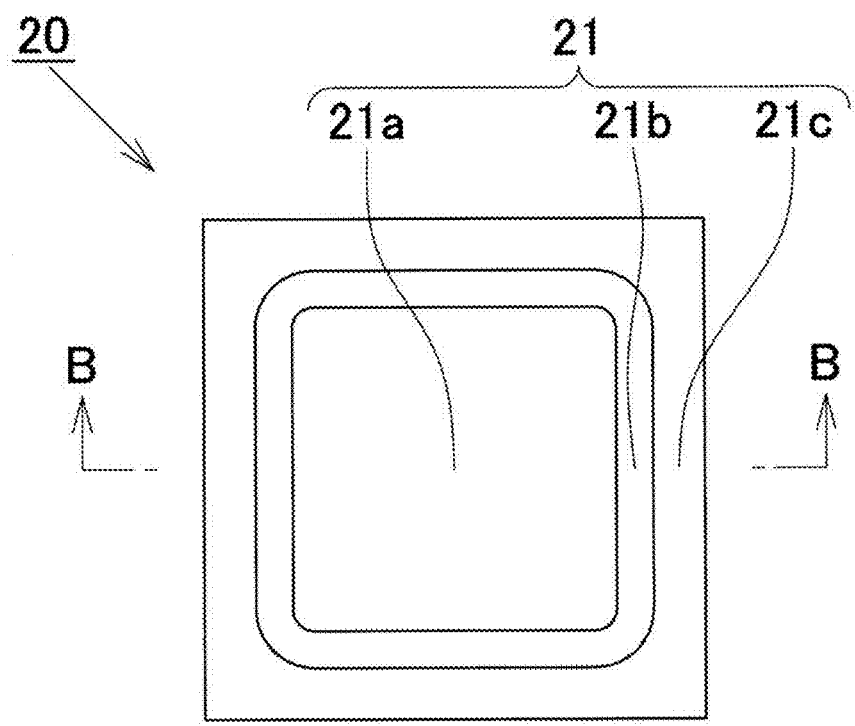
FIG. 7A is a top view showing a main part of the semiconductor chip 20 as an example.
Figure 7B:
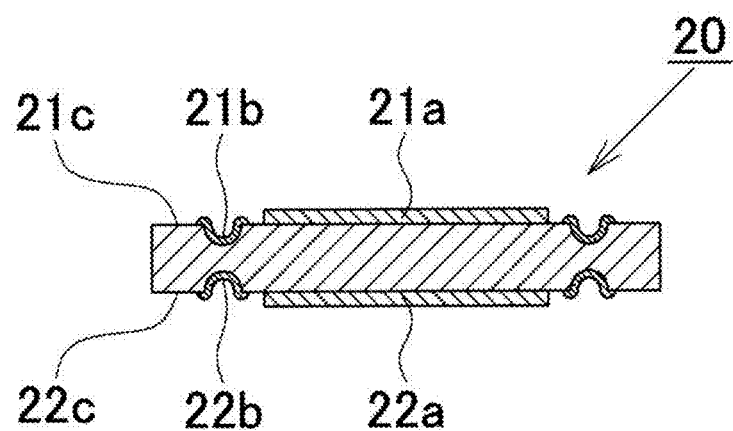
FIG. 7B is a cross sectional view taken along line B-B shown in FIG. 7A.
Figure 8:
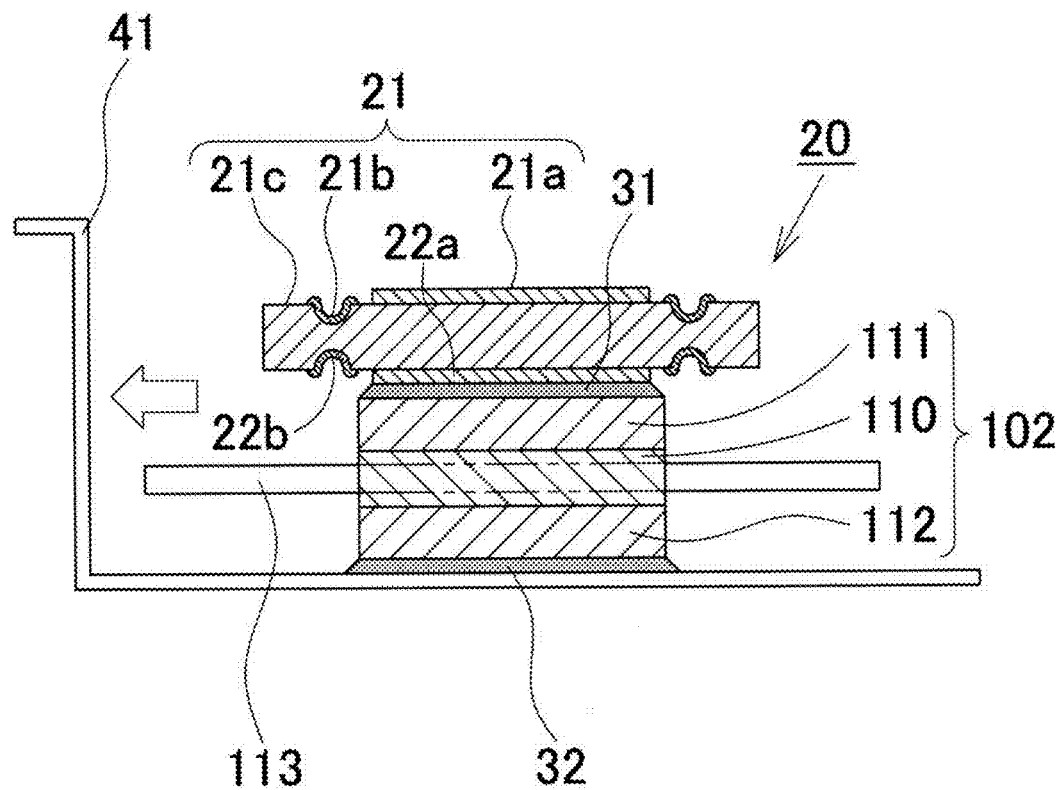
FIG. 8 is a cross sectional view showing a main part of a semiconductor chip.

However, in the laminated member 101, deformation such as warpage due to thermal stress may possibly occur (see FIG. 5). In addition, when the void is generated between the bottom surface of the laminated member 101 and the external leading terminal 41, cooling performance and electrical characteristics (e.g. current density) of the laminated member 101 could deteriorate due to reduction of the bonding area where the laminated member 101 bonds to the external leading terminal 41. Thus, we examined the laminated member, which can prevent deformation such as warpage due to thermal stress, and discovered the following cross-shaped laminated member.

First Embodiment

<Cross-Shaped Laminated Member>

Figure 1A:
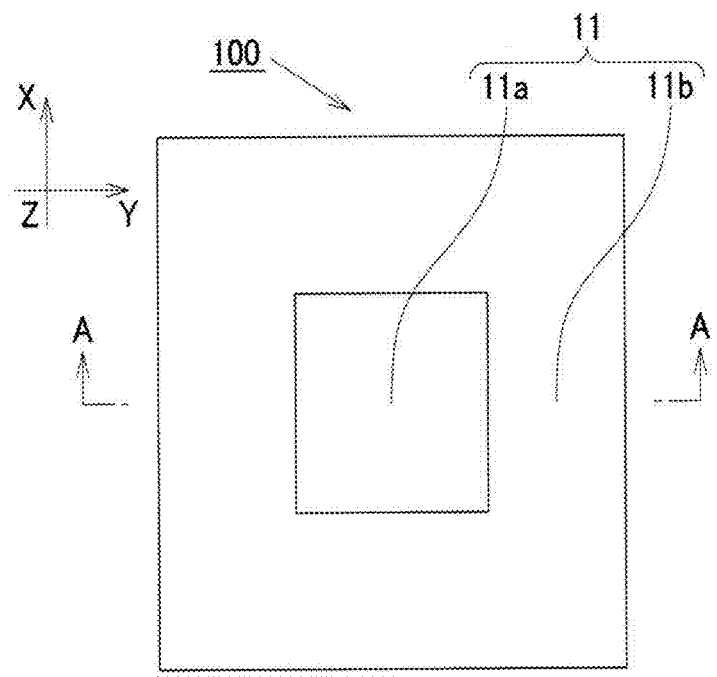
FIG. 1A is a top view showing a main part of a laminated member.
Figure 1B:
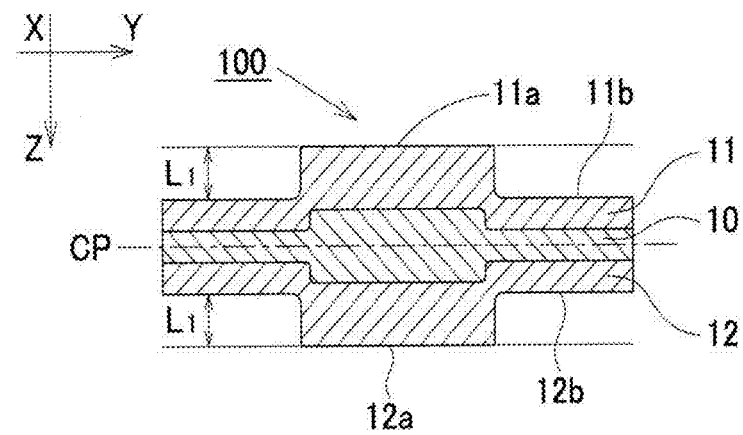
FIG. 1B is a cross sectional view taken along line A-A shown in FIG. 1A.

FIG. 1A is a top view showing a main part of a laminated member and FIG. 1B is a cross sectional view taken along line A-A shown in FIG. 1A. A vertical direction is defined as a Z direction, a direction perpendicular to the Z direction is defined as an X direction, and a direction perpendicular to the Z direction and the X direction is defined as a Y direction. The laminated member 100 is a laminated body with a three-layer structure consisting of an upper highly thermally conductive layer 11, an intermediate layer having a low thermal expansion coefficient 10, and a lower highly thermally conductive layer 12.

The intermediate layer having a low thermal expansion coefficient 10 includes, for example, layers of an alloy of iron and nickel, an alloy of nickel, iron, and cobalt, and the like, wherein Invar (registered trademark) which is an alloy of iron and nickel in a specific ratio is explained as an example. The coefficient of thermal expansion of Invar is $1.5 \times 10^{-6}/°C$. Also, the highly thermally conductive layers 11 and 12 include, for example, layers of silver, copper, carbon nanotube, and the like, wherein copper is explained as an example.

The laminated member 100 is in a cross shape having a thicker central part and thinner left and right parts when viewed from the front (X direction). Specifically, the top surface of the left part and the top surface of the right part are located a certain distance L1 below the height of the top surface of the central part, while the bottom surface of the left part and the bottom surface of the right part are located the certain distance L1 above the height of the bottom surface of the central part. That is, the shape of the bottom surface and the shape of the top surface are plane-symmetrical with each other at a central horizontal plane CP when viewed from the front (X direction).

Also, the laminated member 100 is in a cross shape having a thicker central part and thinner front and rear parts, when viewed from the left (Y direction). Specifically, the top surface of the front part and the top surface of the rear part are located the certain distance L1 below the height of the top surface of the central part, while the bottom surface of the front part and the bottom surface of the back part are located the certain distance L1 above the height of the bottom surface of the central part. That is, the shape of the bottom surface and the shape of the top surface are plane-symmetrical with each other at a central horizontal plane CP', when viewed from the left (Y direction).

The laminated member 100 has a first bonding area 11a in a square shape and a first peripheral area 11b formed in the peripheral edge of the first bonding area 11a, when viewed from the top (Z direction). The first bonding area 11a is formed so as to have the same shape as the shape of an electrode 22a of a semiconductor chip 20 to be attached. The laminated member 100 also has a second bonding area 12a in a square shape and a second peripheral area 12b formed in the peripheral edge of the second bonding area 12a, when viewed from the bottom (−Z direction). The second bonding area 12a has the same shape as the shape of the first bonding area 11a. In addition, the circumference of the laminated member 100 is larger than that of the semiconductor chip 20 to be attached. The size (area) of the laminated member 100 in the plan view depends on the size (area) of the semiconductor chip 20, while it is preferably formed to certainly prevent the semiconductor chip 20 from contacting an electronic part to be arranged around the semiconductor chip 20.

Figure 2A:
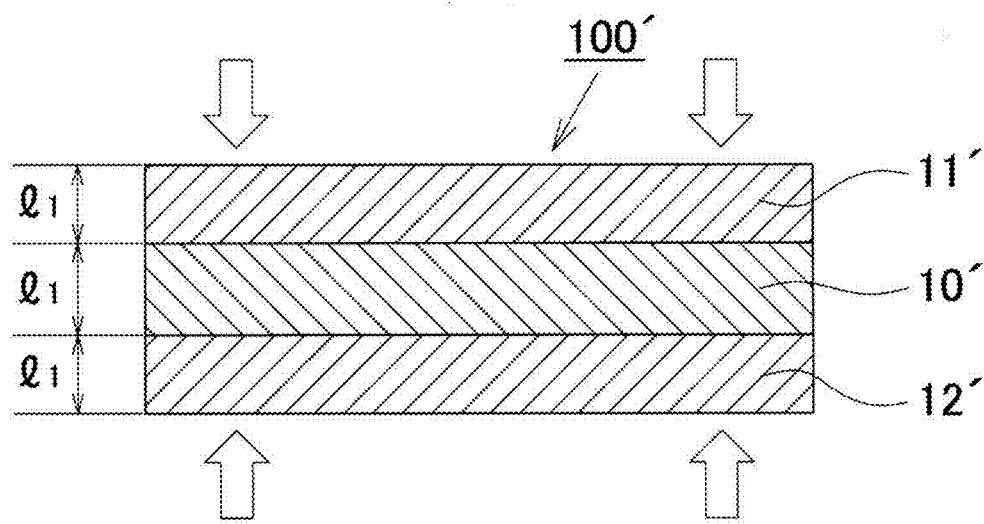
FIG. 2A is a cross sectional view of a pre-compression laminated body with a three-layer structure.
Figure 2B:
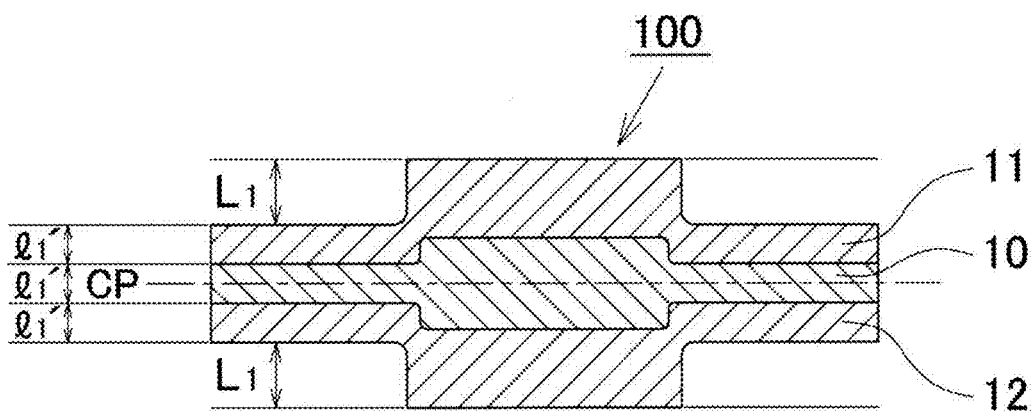
FIG. 2B is a cross sectional view of a post-compression laminated member 100.

Described below is a method for manufacturing the laminated member 100. The peripheral edge area of a laminated body with a three-layer structure is compressed simultaneously from above and below to manufacture the laminated member 100. FIG. 2A is a cross sectional view of a pre-compression laminated body with a three-layer structure, and FIG. 2B is a cross sectional view of a post-compression laminated member 100.

The laminated body 100' of FIG. 2A has an upper copper layer 11' having a thickness l1, an invar layer 10' having a thickness l1 and a lower copper layer 12' having a thickness l1. The peripheral edge area of such a laminated body 100' is simultaneously compressed with a deformation amount L1 from above and below to manufacture the laminated member 100 of FIG. 2B. The laminated member 100 has an upper copper layer 11 having a thickness l1, an invar layer 10 having a thickness l1 and a lower copper layer 12 having a thickness l1 in the central part. It also has an upper copper layer 11 having a thickness l1', an invar layer 10 having a thickness l1' and a lower copper layer 12 having a thickness l1' in the left, right, front and rear parts. A central horizontal surface of the invar layer 10 located at the central part, and a central horizontal surface of the invar layer 10 located at the left, right, front and rear parts align along a horizontal plane CP, and there is no twisting in the invar layer 10. Thus, upwardly and downwardly compressing the laminated member with the same deformation amount provides a plane-symmetrical shape at a horizontal plane, so that thermal stress could be uniformly applied to prevent warpage. Therefore, even if the length of the laminated member 100 in the X and Y directions is increased, it is possible to prevent deterioration of cooling performance and electrical characteristics (e.g. current density) of the laminated member 100. In this example, the upper copper part 11, the invar layer 10 and the lower copper layer 12 are represented as having the same thicknesses, but the invar layer may have a different thickness.

<Semiconductor Module>

Figure 3:
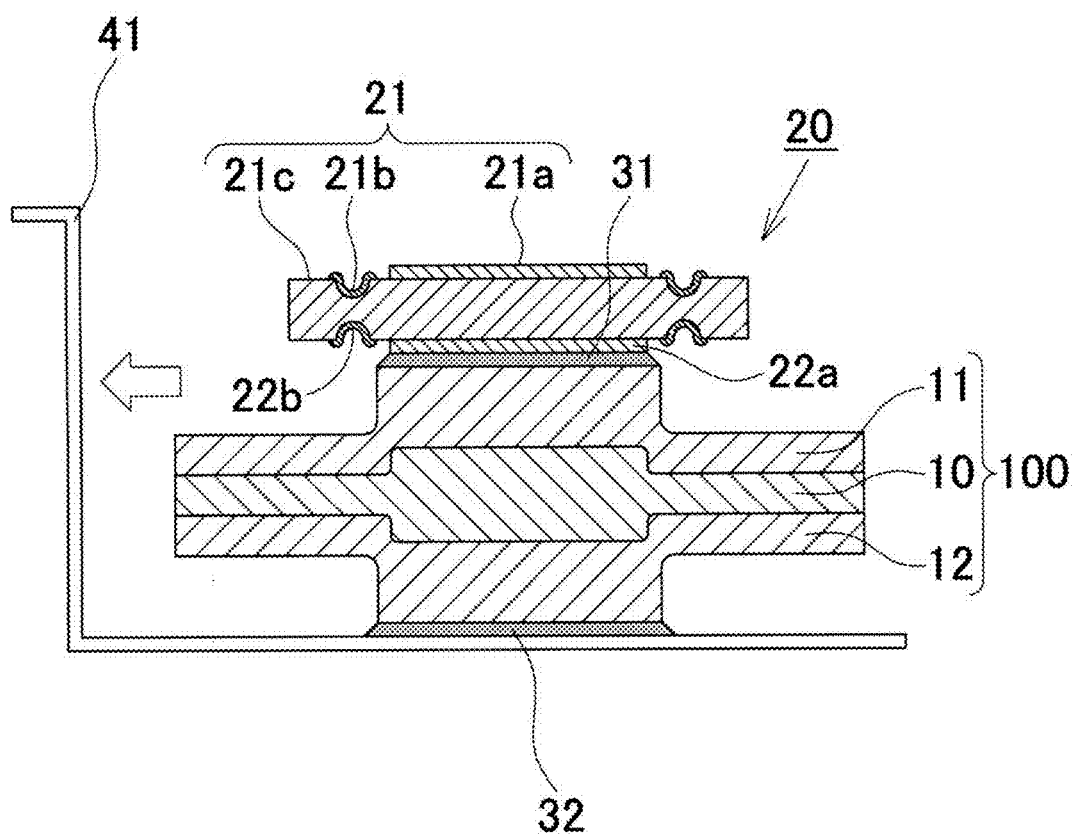
FIG. 3 is a cross sectional view showing a main part of a semiconductor module.

FIG. 3 is a cross sectional view showing a main part of a semiconductor module. The semiconductor module has a heat sink (not shown) having an insulated substrate with a conductive pattern bonded on a heat dissipation base made of aluminum or copper, an external leading terminal 41 bonded to the conductive pattern, a semiconductor chip 20 such as, for example, a thyristor and diode, and a laminated member of the embodiment 1 arranged through solders 31 and 32 between the external leading terminal 41 and the semiconductor chip 20.

According to the laminated member 100 of the embodiment, the size (area) of the laminated member 100 is larger than that of the semiconductor chip 20 in the plan view, preventing the semiconductor chip 20 from contacting the external leading terminal 41 etc. Also, manufacturing a ring for preventing contact between the external leading terminal 41 and the semiconductor chip 20 and attaching the ring to the circumference of the laminated member is not required.

Embodiment 2

Figure 9A:
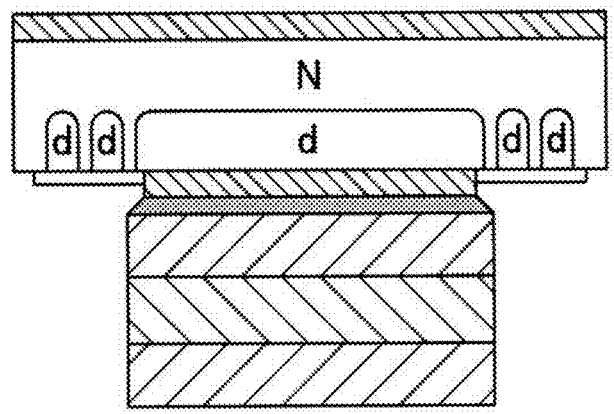
FIG. 9A shows that the semiconductor chip having a guard ring structure is soldered to the laminated member.
Figure 9B:
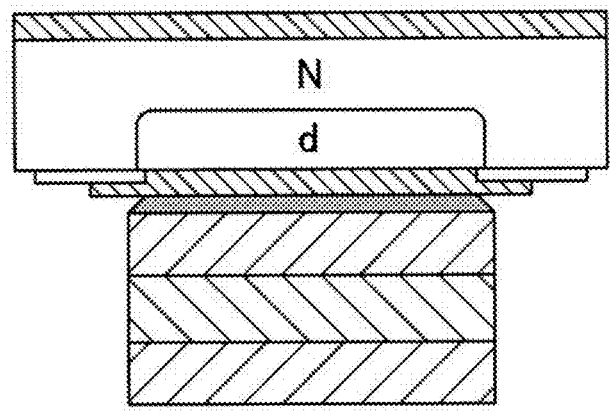
FIG. 9B shows that the semiconductor chip having a field plate structure is soldered to the laminated member.

It has been described in the embodiment 1 that a semiconductor chip 20 soldered to the laminated member 100 has a "mesa structure" formed on its bottom surface. In addition to this, the semiconductor chip 20 may also be configured to have a planar type structure for maintaining pressure resistance (such as a guard ring structure or a field plate structure) formed on its bottom surface. FIG. 9A shows that the semiconductor chip having a guard ring structure is soldered to the laminated member, and FIG. 9B shows that the semiconductor chip having a field plate structure is soldered to the laminated member. The guard ring structure is configured to have an impurity-diffused layer formed under an oxide film of the peripheral edge of an electrode, and the field plate structure is configured to have the electrode extending above the oxide film of the peripheral edge of the electrode.

INDUSTRIAL AVAILABILITY

Since the laminated member of the invention is larger than the semiconductor chip in the plan view, it can prevent the semiconductor chip from contacting the external leading terminal etc., and thus, is useful as a laminated member etc. to be arranged between the semiconductor chip and the heat sink.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

DESCRIPTION OF SYMBOLS

10 Intermediate layer having a low thermal expansion coefficient
11 Upper copper layer
11a First bonding area
11b First peripheral area
12 Lower copper layer
20 Semiconductor chip
41 External leading terminal
100 Laminated member

The invention claimed is:

1. A laminated member having a three-layer structure, comprising:
    an upper highly thermally conductive layer having on a top surface a first bonding area and a first peripheral area;
    a lower highly thermally conductive layer having on a bottom surface a second bonding area and a second peripheral area; and
    an intermediate layer having a low thermal expansion coefficient provided between the upper highly thermally conductive layer and the lower highly thermally conductive layer and including a central portion disposed between the first bonding area and the second bonding area and a peripheral portion disposed between the first peripheral area and the second peripheral area, a thickness of the central portion being greater than a thickness of the peripheral portion.

2. The laminated member of claim 1, wherein a shape of the bottom surface and a shape of the top surface are plane symmetrical about a horizontal plane between the bottom surface and the top surface.

3. The laminated member of claim 2, wherein:
    the first peripheral area is square or circular in a plan view;
    the first bonding area is square or circular in the plan view; and
    the first bonding area is at least partially surrounded by the first peripheral area in the plan view.

4. The laminated member of claim 3, and further including a semiconductor chip bonded to the first bonding area and including a structure for maintaining pressure resistance that surrounds an electrode of the semiconductor chip.

5. The laminated member of claim 4, wherein the structure for maintaining pressure resistance is a mesa structure.

6. The laminated member of claim 4, wherein the structure for maintaining pressure resistance is a guard ring structure.

7. The laminated member of claim 4, wherein the structure for maintaining pressure resistance is a field plate structure.

8. The laminated member of claim 2, and further including a semiconductor chip bonded to the first bonding area and including a structure for maintaining pressure resistance that surrounds an electrode of the semiconductor chip.

9. The laminated member of claim 8, wherein the structure for maintaining pressure resistance is a mesa structure.

10. The laminated member of claim 8, wherein the structure for maintaining pressure resistance is a guard ring structure.

11. The laminated member of claim 8, wherein the structure for maintaining pressure resistance is a field plate structure.

12. The laminated member of claim 1, wherein:
the first peripheral area is square or circular in a plan view;
the first bonding area is square or circular in the plan view; and
the first bonding area is at least partially surrounded by the first peripheral area in the plan view.

13. The laminated member of claim 12, and further including a semiconductor chip bonded to the first bonding area and including a structure for maintaining pressure resistance that surrounds an electrode of the semiconductor chip.

14. The laminated member of claim 13, wherein the structure for maintaining pressure resistance is a mesa structure.

15. The laminated member of claim 13, wherein the structure for maintaining pressure resistance is a guard ring structure.

16. The laminated member of claim 13, wherein the structure for maintaining pressure resistance is a field plate structure.

17. The laminated member of claim 1, and further including a semiconductor chip bonded to the first bonding area and including a structure for maintaining pressure resistance that surrounds an electrode of the semiconductor chip.

18. The laminated member of claim 17, wherein the structure for maintaining pressure resistance is a mesa structure.

19. The laminated member of claim 17, wherein the structure for maintaining pressure resistance is a guard ring structure.

20. The laminated member of claim 17, wherein the structure for maintaining pressure resistance is a field plate structure.

21. The laminated member of claim 1, wherein:
the laminated member includes a central part, the central part including the first bonding area, the central portion of the intermediate layer, and the second bonding area;
the laminated member further includes a peripheral part, the peripheral part including the first peripheral area, the peripheral portion of the intermediate layer, and the second peripheral area; and
a thickness of the central part is greater than a thickness of the peripheral part in each of the upper highly thermally conductive layer, the lower highly thermally conductive layer, and the intermediate layer.

22. The laminated member of claim 1, wherein:
the intermediate layer includes an upper surface and a lower surface;
the upper surface of the intermediate layer includes a first central area and a third peripheral area, wherein an upper surface of the first central area is higher than an upper surface of the third peripheral area; and
the lower surface of the intermediate layer includes a second central area and a fourth peripheral area, wherein a lower surface of the second central area is lower than a lower surface of the fourth peripheral area.

23. The laminated member of claim 1, and further including:
a semiconductor chip bonded to the first bonding area, the semiconductor chip being smaller than the laminated member in a plan view; and
a heat sink bonded to the second bonding area.

24. The laminated member of claim 23, wherein the first bonding area has the same shape as an electrode of the semiconductor chip.

25. The laminated member of claim 1, wherein:
an upper surface of the first peripheral area is located at a certain distance below an upper surface of the first bonding area; and
a lower surface of the second peripheral area is located at a certain distance above a lower surface of the second bonding area.

* * * * *